(12) United States Patent
Takahashi

(10) Patent No.: US 10,761,318 B2
(45) Date of Patent: Sep. 1, 2020

(54) MIRROR DEVICE, MIRROR DRIVE METHOD, LIGHT IRRADIATION DEVICE, AND IMAGE ACQUISITION DEVICE

(71) Applicant: HAMAMATSU PHOTONICS K.K., Hamamatsu-shi, Shizuoka (JP)

(72) Inventor: Akira Takahashi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/095,020

(22) PCT Filed: Mar. 16, 2017

(86) PCT No.: PCT/JP2017/010641
§ 371 (c)(1),
(2) Date: Oct. 19, 2018

(87) PCT Pub. No.: WO2017/183368
PCT Pub. Date: Oct. 26, 2017

(65) Prior Publication Data
US 2019/0121125 A1  Apr. 25, 2019

(30) Foreign Application Priority Data

Apr. 22, 2016 (JP) ................................ 2016-086122

(51) Int. Cl.
*G02B 26/10* (2006.01)
*G02B 26/08* (2006.01)
(Continued)

(52) U.S. Cl.
CPC ....... *G02B 26/105* (2013.01); *G01N 21/6458* (2013.01); *G01S 7/4817* (2013.01);
(Continued)

(58) Field of Classification Search
CPC .......... G01S 7/48; G01S 7/481; G01S 7/4817; G01S 17/26; G02B 21/0004;
(Continued)

(56) References Cited

U.S. PATENT DOCUMENTS

| 2012/0236379 A1 | 9/2012 | da Silva et al. |
| 2014/0153001 A1* | 6/2014 | Chayat .................... G01S 17/89 356/612 |

(Continued)

FOREIGN PATENT DOCUMENTS

| CN | 101561619 A | 10/2009 |
| JP | 4223328 B2 | 11/2008 |

(Continued)

OTHER PUBLICATIONS

International Preliminary Report on Patentability dated Nov. 1, 2018 for PCT/JP2017/010641.

*Primary Examiner* — Anastasia Midkiff
(74) *Attorney, Agent, or Firm* — Faegre Drinker Biddle & Reath LLP

(57) ABSTRACT

Provided is a mirror device including a mirror which is supported to be flappable around a fast axis and supported to be flappable around a slow axis and in which a resonance frequency of flapping thereof with respect to the fast axis is a first value and a resonance frequency of the flapping thereof with respect to the slow axis is a second value lower than the first value; a signal extracting portion configured to obtain from a slow axis coil a synthesized signal including an induced signal generated in the slow axis coil due to an operation of flapping the mirror around the fast axis and configured to extract the induced signal from the synthesized signal; and a signal generating portion configured to gener-
(Continued)

ates a driving signal so that the flapping of the mirror with respect to the fast axis is in a resonance state according to the induced signal.

12 Claims, 15 Drawing Sheets

(51) Int. Cl.
*G01N 21/64* (2006.01)
*H01J 37/29* (2006.01)
*G01S 7/481* (2006.01)
*H01J 37/28* (2006.01)
*H01J 37/304* (2006.01)
*G02B 21/00* (2006.01)

(52) U.S. Cl.
CPC ......... *G02B 21/0048* (2013.01); *G02B 26/08* (2013.01); *G02B 26/085* (2013.01); *G02B 26/0833* (2013.01); *G02B 26/10* (2013.01); *H01J 37/28* (2013.01); *H01J 37/29* (2013.01); *H01J 37/3045* (2013.01); *G01N 2201/0636* (2013.01); *G01N 2201/1053* (2013.01); *H01J 2237/0245* (2013.01); *H01J 2237/2482* (2013.01)

(58) Field of Classification Search
CPC ............ G02B 21/002; G02B 21/0024; G02B 21/0036; G02B 21/0048; G02B 26/08; G02B 26/0816; G02B 26/0833; G02B 26/085; G02B 26/10; G02B 26/105; G01N 21/6458; G01N 21/6463; G01N 2201/10; G01N 2201/105; G01N 2201/1053; G01N 2201/0636; G01N 2201/06; H01J 37/28; H01J 37/29; H01J 37/292; H01J 37/304; H01J 37/3045; H01J 2237/024; H01J 2237/0245; H01J 2237/15; H01J 2237/1502–1504; H01J 2237/1506; H01J 2237/2482; H01J 2237/2485
See application file for complete search history.

(56) References Cited

U.S. PATENT DOCUMENTS

| 2014/0268268 | A1* | 9/2014 | Kin ..................... G02B 26/105 359/200.6 |
| 2015/0277107 | A1* | 10/2015 | Aimono ............. G02B 26/0858 359/198.1 |

FOREIGN PATENT DOCUMENTS

| JP | 2009-258321 A | 11/2009 |
| JP | 2011-107505 A | 6/2011 |
| JP | 5397184 B2 | 11/2013 |
| JP | 2015-212784 A | 11/2015 |
| WO | WO 2012/027410 A1 | 3/2012 |

* cited by examiner

MIRROR DEVICE, MIRROR DRIVE METHOD, LIGHT IRRADIATION DEVICE, AND IMAGE ACQUISITION DEVICE

TECHNICAL FIELD

The present disclosure relates to a mirror device, a mirror drive method, a light irradiation device, and an image acquisition device.

CITATION LIST

Patent Documents

[Patent Document 1] Japanese Unexamined Patent Publication No. 2009-258321

BACKGROUND ART

Patent Document 1 discloses an electromagnetically driven scanning mirror. The scanning mirror is controlled such that it flaps around a predetermined axis in a resonance state. A control signal for driving the scanning mirror is generated using a counter-electromotive force generated by driving the scanning mirror.

SUMMARY OF INVENTION

Technical Problem

In the device of Patent Document 1, since the counter electromotive force is detected in a form in which it has been added to the driving signal, it is necessary to extract a signal component corresponding to the counter electromotive force from the detected signal. However, a frequency of the driving signal and a frequency of the counter electromotive force are the same, and an amplitude of the counter electromotive force with respect to an amplitude of the driving signal is small. Therefore, it is difficult to extract a component of the counter electromotive force from the detected signal. Since the driving signal of the scanning mirror is generated using the counter electromotive force, it is difficult to reliably drive the scanning mirror in the resonance state when it is difficult to extract the component of the counter electromotive force.

Therefore, an object of the present disclosure is to provide a mirror device capable of driving a mirror in a resonance state, a mirror drive method, a light irradiation device, and an image acquisition device.

Solution to Problem

One embodiment of the present disclosure is a mirror device. The mirror device includes a mirror supported to be rotatable around a first drive axis and supported to be rotatable around a second drive axis intersecting the first drive axis and in which a resonance frequency of rotating thereof with respect to the first drive axis is a first value and a resonance frequency of the flopping-rotating thereof with respect to the second drive axis is a second value lower than the first value; a first drive portion configured to rotate the mirror around the first drive axis; a second drive portion configured to rotate the mirror around the second drive axis; a signal extracting portion configured to obtain from the second drive portion a synthesized signal including an induced signal generated in the second drive portion due to an operation of rotating the mirror around the first drive axis and configured to extract the induced signal from the synthesized signal; and a signal generating portion configured to generate a driving signal which controls the first drive portion so that the rotating of the mirror with respect to the first drive axis is in a resonance state according to the extracted induced signal.

Another embodiment of the present disclosure is a mirror drive method. The driving method is for a mirror which is supported to be a rotatable around a first drive axis and is supported to be rotatable around a second drive axis intersecting the first drive axis and in which a resonance frequency of rotating thereof with respect to the first drive axis is a first value and a resonance frequency of the rotating thereof with respect to the second drive axis is a second value lower than the first value, the method including a step (rotating step) of controlling a first drive portion such that the mirror rotates around the first drive axis; a step (acquiring step) of obtaining from a second drive portion a synthesized signal including an induced signal generated in the second drive portion due to an operation of rotating the mirror around the first drive axis; a step (extracting step) of extracting the induced signal from the synthesized signal; and a step (generating step) of generating a driving signal which controls the first drive portion so that the rotating of the mirror with respect to the first drive axis is in a resonance state according to the extracted induced signal.

The mirror is rotated around the first drive axis by the first drive portion. While this mirror is rotating around the first drive axis, the signal extracting portion obtains the synthesized signal from the second drive portion. This synthesized signal includes the induced signal generated in the second drive portion due to the operation of rotating the mirror around the first drive axis. Since the induced signal is caused by the operation of the first drive portion, a frequency thereof corresponds to a frequency of the rotation of the mirror with respect to the first drive axis. Since the frequency of the rotation of the mirror with respect to the first drive axis is higher than the frequency of the rotation of the mirror with respect to the second drive axis, it is possible to easily extract the induced signal from the signal obtained from the second drive portion. Additionally, the signal generating portion generates a driving signal which is provided to the first drive portion according to the induced signal. Therefore, it is possible to obtain a result of rotating the mirror with the first drive portion according to the induced signal from the second drive portion. Accordingly, since a feedback loop system relating to the rotation of the mirror with respect to the first drive axis is formed, it is possible to reliably drive the mirror with respect to the first drive axis in a resonance state.

The signal generating portion may generate the driving signal according to a phase difference between a phase of the driving signal input from the signal generating portion to the first drive portion and a phase of the induced signal obtained by the signal extracting portion. Further, the generating step may generate the driving signal according to a phase difference between a phase of the driving signal input to the first drive portion and a phase of the induced signal obtained in the extracting step. Furthermore, the signal generating portion may generate the driving signal so that the phase difference becomes a constant value. Also, the generating step may generate the driving signal so that the phase difference becomes a constant value. Further, the signal generating portion may generate the driving signal to reduce the phase difference. The generating step may generate the driving signal so that the phase difference becomes small. According to these configurations, a difference between a frequency of the driving signal and a resonance frequency in the locking of the mirror with respect to the first drive axis is indicated as a phase difference between the phase of the driving signal and the phase of the induced signal. The frequency of the driving signal can be easily adjusted to the resonance frequency by adjusting the frequency of the driving signal so that this phase difference is set to be a constant value or to be small. The constant value may be zero.

The signal generating portion may generate the driving signal according to an amplitude of the induced signal obtained by the signal extracting portion. The generating step may generate the driving signal according to an amplitude of the induced signal obtained in the extracting step. Further, the signal generating portion may generate the driving signal so that the amplitude of the induced signal increases. Further, the generating step may generate the driving signal so that the amplitude of the induced signal increases. According to these configurations, the difference between the frequency of the driving signal and the resonance frequency in the rotating of the mirror with respect to the first drive axis is indicated as the amplitude of the induced signal. The frequency of the driving signal can be easily adjusted to the resonance frequency by adjusting the frequency of the driving signal so that the amplitude becomes large.

The signal extracting portion may include a signal filter portion, and the signal filter portion may pass a signal including a frequency higher than the second value. Further, in the extracting step, a signal including a frequency higher than the second value may be passed by the signal filter portion. Further, the signal filter portion may attenuate a signal including a frequency smaller than the second value. Furthermore, in the extracting step, the signal filter portion may attenuate a signal including a frequency smaller than the second value. According to these configurations, the induced signal can be accurately extracted from the synthesized signal.

The signal extracting portion may include a signal amplifier, and the signal amplification portion may amplify a signal including a frequency higher than the second value. In the extracting step, the signal amplifier may amplify a signal including a frequency higher than the second value. According to these configurations, the induced signal can be accurately extracted from the synthesized signal.

Yet another embodiment of the present disclosure is a light irradiation device which irradiates light on an object. The light irradiation device includes a light source configured to output light, and a mirror device configured to scan the light output from the light source. Still another embodiment of the present disclosure is a light irradiation method which irradiates light onto an object. The light irradiation method includes an output step of outputting light from a light source, and the above-described mirror drive method which scans the light output from the light source. Yet still another embodiment of the present disclosure is an image acquisition device which obtains an image of an object. The image acquisition device includes the above-described light irradiation device, and a photodetector configured to detect light generated in the object according to radiation of the light by the light irradiation device. Further, yet still another embodiment is an image acquiring method for acquiring an image of an object. The image acquiring method includes the above-described light irradiating method and a detection step of detecting light generated in the object in accordance with the light irradiation by the light irradiating method. According to these aspects, since the mirror device can reliably drive the mirror in the resonance state around the first drive axis, the light irradiation and the image acquisition can be reliably performed.

Advantageous Effects of Invention

According to the embodiment, a mirror device capable of driving a mirror in a resonance state, a mirror drive method, a light irradiation device, and an image acquisition device are provided.

DESCRIPTION OF EMBODIMENTS

Figure 1:
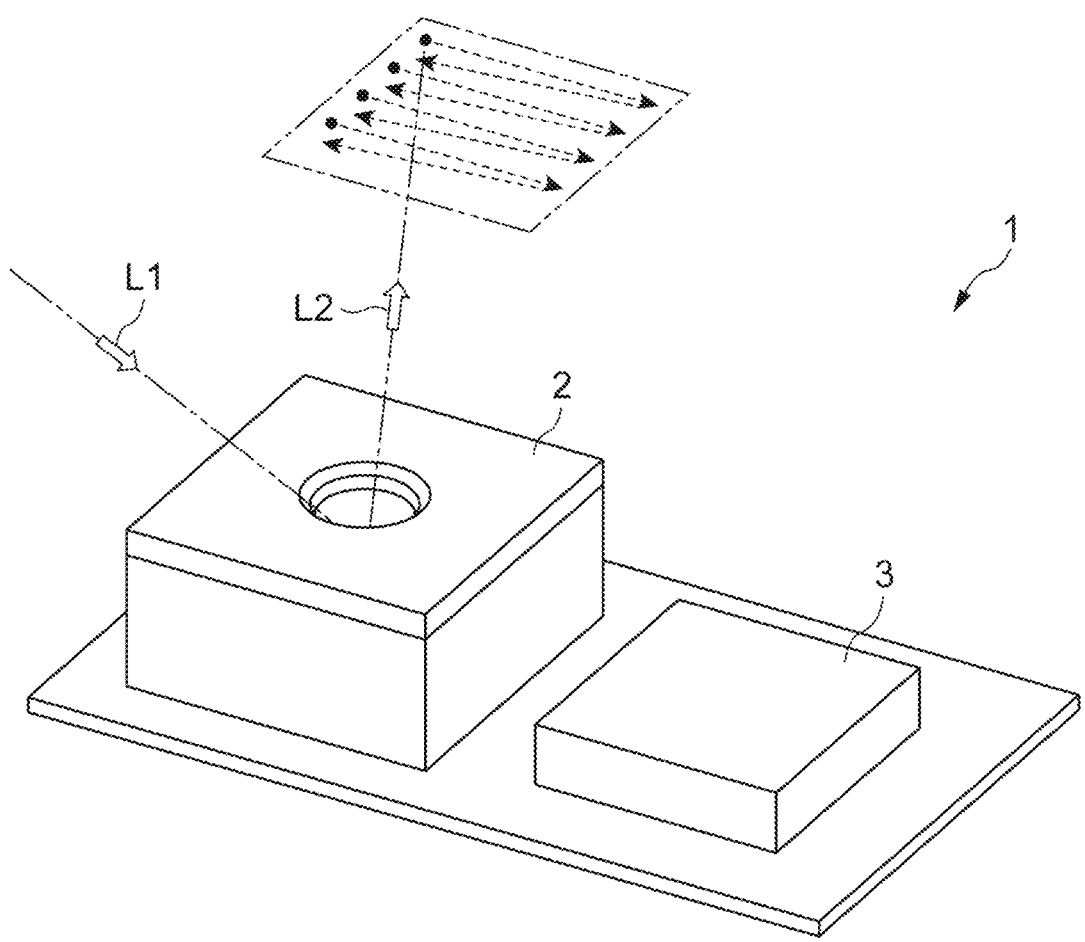
FIG. 1 is a perspective view showing a configuration of a mirror device according to an embodiment.

Hereinafter, a mirror device, a mirror drive method, a light irradiation device, and an image acquisition device will be described in detail with reference to the accompanying drawings. In the description of the drawings, the same elements are designated by the same reference numerals, and duplicate descriptions will be omitted.

As shown in FIG. 1, a mirror device 1 according to the embodiment includes a mirror unit 2 and a control unit 3. Light L1 is incident on the mirror unit 2. The light L1 includes, for example, coherent light such as laser light, or incoherent light such as light output from a light emitting diode. Additionally, the mirror unit 2 reflects the incident light L1 while changing an optical path of reflected light L2. The control unit 3 inputs a driving signal to the mirror unit 2. The optical path of the reflected light L2 is controlled on the basis of this driving signal.

Figure 2:
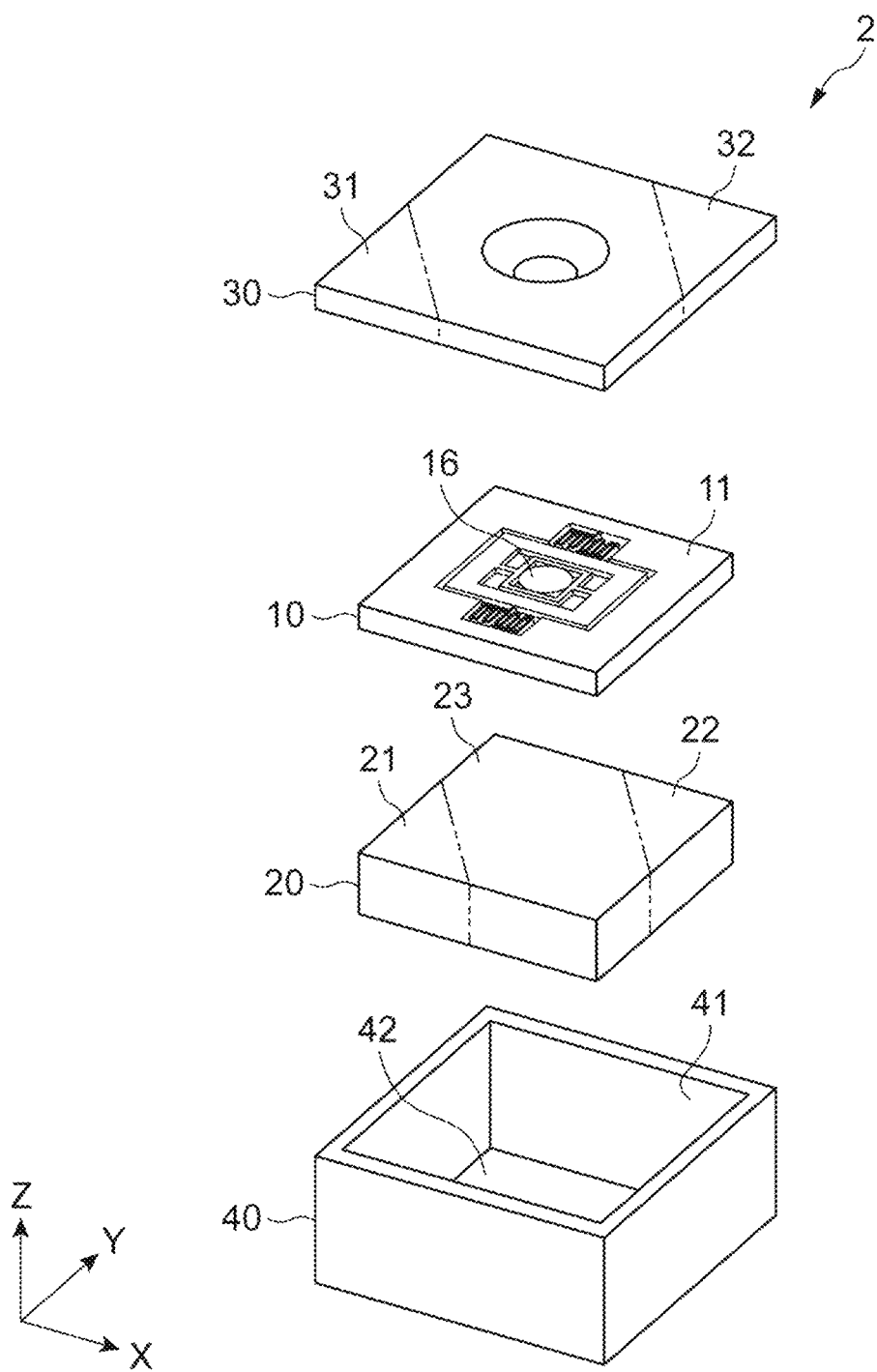
FIG. 2 is an exploded perspective view of a mirror unit shown in FIG. 1.

FIG. 2 is an exploded perspective view of the mirror unit 2. For convenience of explanation, X, Y and Z axes are provided in each of the drawings. As shown in FIG. 2, the mirror unit 2 has a mirror structure 10, a lower magnetic body 20, a cap structure 30, and a casing 40. The casing 40 has a substantially rectangular parallelepiped shape and accommodates the mirror structure 10 and the lower magnetic body 20. The lower magnetic body 20 is disposed on a bottom surface 42 of the casing 40. The mirror structure 10 is disposed above the lower magnetic body 20 (a positive side of the Z axis). The cap structure 30 is disposed to cover an opening portion 41 of the casing 40.

Figure 3:
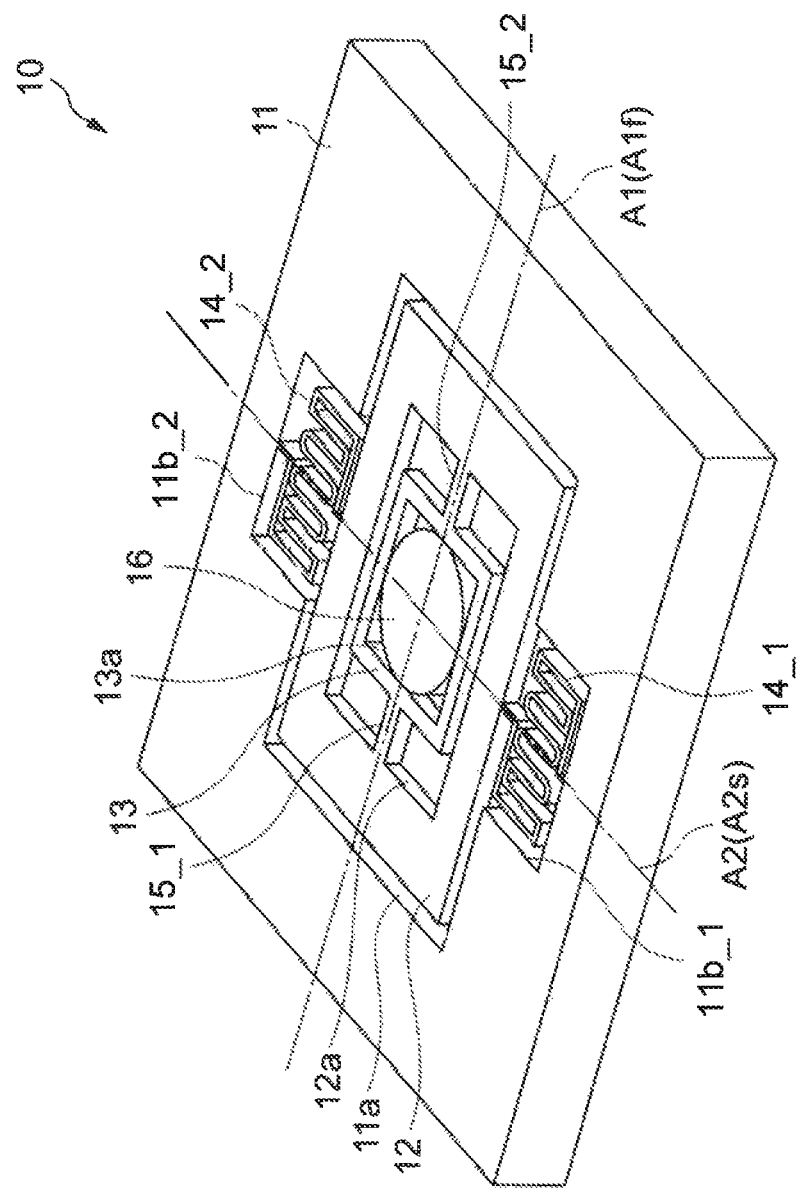
FIG. 3 is a perspective view showing a mirror structure shown in FIG. 2.
Figure 4:
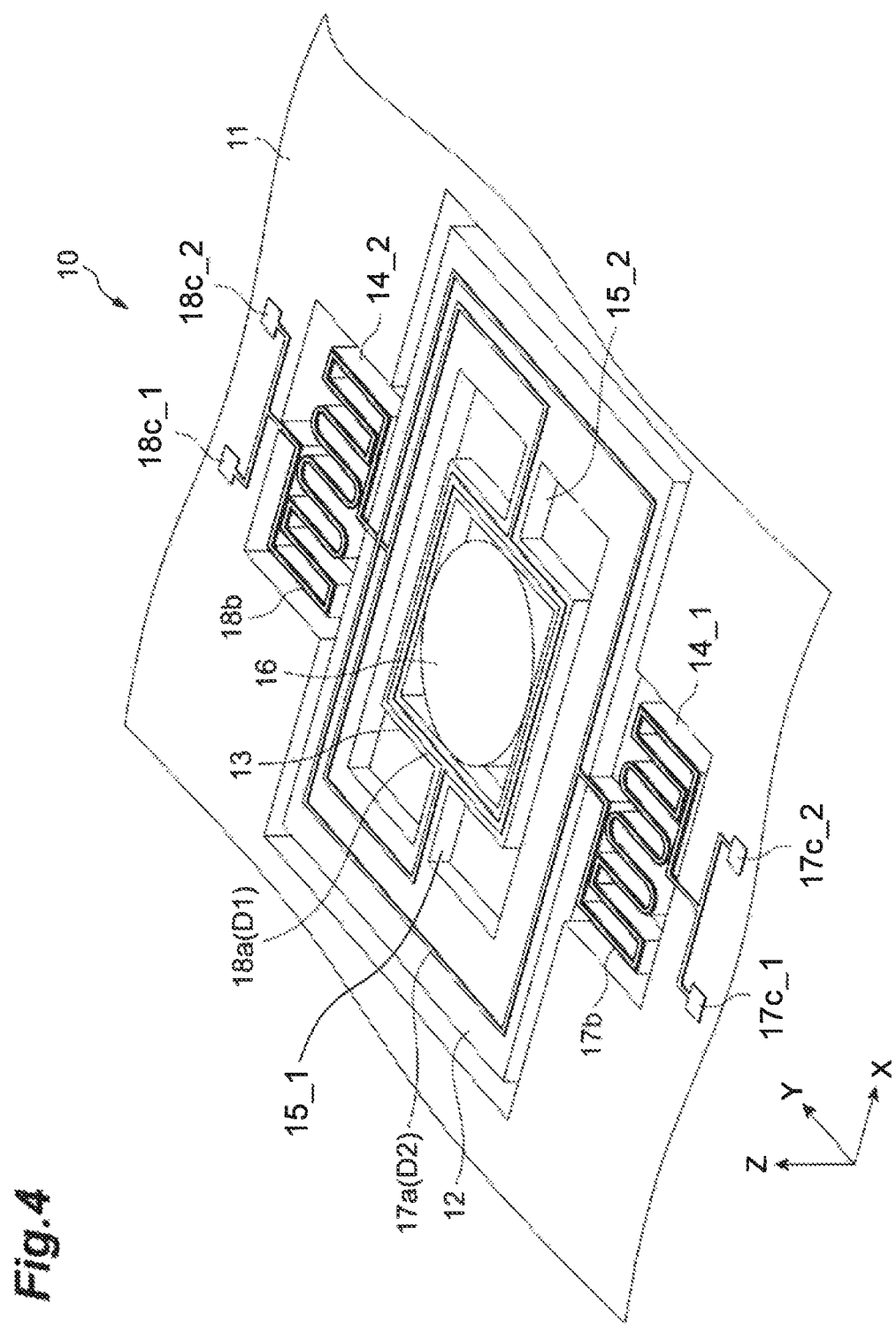
FIG. 4 is a perspective view showing an arrangement of a first coil and a second coil in the mirror structure.

A configuration of the mirror structure 10 will be described in detail with reference to FIGS. 3 and 4. FIG. 3 is a perspective view of the mirror structure 10. FIG. 4 is a perspective view showing an arrangement of a second coil 17a and a first coil 18a in the mirror structure 10. As shown in FIGS. 3 and 4, the mirror structure 10 includes a support portion 11, a second movable portion 12, a first movable portion 13, and a mirror 16. The second movable portion 12 is connected to the support portion 11. The first movable portion 13 is connected to the second movable portion 12. The mirror 16 is supported by the first movable portion 13.

The support portion 11 is a frame body and has a rectangular shape when seen in the Z axis direction. A rectangular opening portion 11a is provided in the support portion 11. A pair of substantially rectangular concave portions 11b_1 and 11b_2 are provided on two sides of an outer edge of the opening portion 11a which extend in the X axis direction.

The second movable portion 12 is disposed in the opening portion 11a of the support portion 11. The second movable portion 12 is connected to the support portion 11 by a pair of second beam portions 14_1 and 14_2. Further, the second movable portion 12 is physically connected to the first movable portion 13 by a pair of first beam portions 15_1 and 15_2. The pair of second beam portions 14_1 and 14_2 are located on a straight line A2 parallel to the Y axis and are provided on both sides of the second movable portion 12. The second beam portions 14_1 and 14_2 support the second movable portion 12 to be rotatable around or to oscillate about the straight line A2 with respect to the support portion 11. The second beam portions 14_1 and 14_2 have a meandering shape when seen in the Z direction. According to such a shape, the second beam portions 14_1 and 14_2 have a relatively small torsional rigidity around the straight line A2. The second movable portion 12 has a rectangular opening portion 12a.

The first movable portion 13 is a frame body and has a rectangular shape when seen in the Z axis direction. A rectangular opening portion 13a is provided in the first movable portion 13. The first movable portion 13 is connected to the second movable portion 12 by the pair of first beam portions 15_1 and 15_2. Further, the first movable portion 13 is physically connected to the mirror 16. The pair of first beam portions 15_1 and 15_2 are located on a straight line A1 parallel to the X axis and are provided on both sides of the first movable portion 13. The first portions 15_1 and 15_2 support the first movable portion 13 to be rotatable around or to oscillate about the straight line A1 with respect to the second movable portion 12. The first beam portions 15_1 and 15_2 extend linearly in the X axis direction. According to such a shape, the first beam portions 15_1 and 15_2 have a relatively large torsional rigidity around the straight line A1. For example, the torsional rigidity of the first beam portions 15_1 and 15_2 is larger than the torsional rigidity of the second beam portions 14_1 and 14_2.

The mirror 16 is disposed on a surface of the first movable portion 13 facing the cap structure 30. The mirror 16 has a light reflection film formed of a metal thin film or the like.

As described above, the mirror 16 rotates around the straight line A2 and rotates around the straight line A1. This rotating motion will be further explained. First, the mirror structure 10 constitutes a first vibration system in which the first movable portion 13 and the mirror 16 serve as mass elements and the pair of first beam portions 15_1 and 15_2 serve as elastic elements. This first vibration system has a resonance frequency based on a total mass of the first movable portion 13 and the mirror 16 and an elastic coefficient of the first beam portions 15_1 and 15_2. Hereinafter, the resonance frequency of the first vibration system is referred to as a first resonance frequency. More specifically, since the first vibration system concerns rotating around the straight line A1 (reciprocating rotational motion), the total mass is a moment of inertia around the straight line A1, and the elastic coefficient is the torsional rigidity of the first beam portions 15_1 and 15_2.

Furthermore, the mirror structure 10 constitutes a second vibration system in which the second movable portion 12, the first movable portion 13 and the mirror 16 serve as mass elements and the pair of second beam portions 14_1 and 14_2 serve as elastic elements. This second vibration system has a resonance frequency based on a total mass of the second movable portion 12, the first movable portion 13 and the mirror 16 and an elastic coefficient of the second beam portions 14_1 and 14_2. Hereinafter, the resonance frequency of the second vibration system is referred to as a second resonance frequency. More specifically, since the second vibration system concerns rotating around the straight line A2 (reciprocating rotational motion), the total mass is a moment of inertia around the straight line A2, and the elastic coefficient is the torsional rigidity of the second beam portions 14_1 and 14_2.

Here, the moment of inertia of the first vibration system is smaller than the moment of inertia of the second vibration system by a moment of inertia of the second movable portion 12. In addition, the torsional rigidity of the first vibration system is larger than the torsional rigidity of the second vibration system. The resonance frequency (more accurately, natural frequency) is inversely proportional to the moment of inertia (mass) and is proportional to the torsional rigidity (elastic coefficient). Therefore, the resonance frequency of the first vibration system is larger than the resonance frequency of the second vibration system.

As shown in FIG. 4, the mirror structure 10 further includes a second coil 17a and a first coil 18a. The second coil 17a is disposed in the second movable portion 12. The second coil 17a cooperates with the lower magnetic body 20 (refer to FIG. 2) and the cap structure 30 (refer to FIG. 2) to generate an electromagnetic force which rotates the mirror 16 around the straight line A2 (refer to FIG. 3). Therefore, the second coil 17a, the lower magnetic body 20, and the cap structure 30 constitute a second drive portion D2. The second drive portion D2 is physically connected to a first drive portion D1. The second coil 17a has a rectangular shape when seen in the Z direction. In the following description, it is assumed that a rectangle includes a square. The second coil 17a is electrically connected to a pair of pads 17c_1 and 17c_2 on the support portion 11 by a wiring 17b disposed on one second beam portion 14_2. Therefore, a current is supplied to the second coil 17a by supplying the current between the pair of pads 17c_1 and 17c_2.

The first coil 18a is disposed in the first movable portion 13. The first coil 18a cooperates with the lower magnetic body 20 and the cap structure 30 to generate an electromagnetic force which rotates the mirror 16 around the straight line A1. Accordingly, the first coil 18a, the lower magnetic body 20 (refer to FIG. 2), and the cap structure 30 (refer to FIG. 2) constitute the first drive portion D1. Therefore, the first drive portion D1 is physically connected to the mirror 16. In addition, the first coil 18a has a rectangular shape when seen in the Z direction. The first coil 18a is electrically connected to the pair of pads 18c_1 and 18c_2 on the support portion 11 by a wiring 18b disposed on the first beam portions 15_1 and 15_2, the second movable portion 12 and the other second beam portion 14_1. Therefore, a current is supplied to the first coil 18a by supplying the current between the pair of pads 18c_1 and 18c_2.

The mirror structure 10 having the above-described configuration is integrally formed by forming the second movable portion 12, the first movable portion 13, the second beam portions 14_1 and 14_2, and the first beam portions 15_1 and 15_2, for example, by performing a process, such as anisotropic etching, on a semiconductor substrate such as silicon.

As shown in FIG. 2, the lower magnetic body 20 has a rectangular parallelepiped shape integrally formed. The lower magnetic body 20 is disposed on a back surface side of the surface of the mirror structure 10 on which the mirror 16 is disposed, that is, on a negative side of the Z axis.

The lower magnetic body 20 has a first magnetic portion 21, a second magnetic portion 22, and a third magnetic portion 23. The first magnetic portion 21 and the second magnetic portion 22 are disposed in a direction intersecting a direction in which the respective sides of the second coil 17a and the first coil 18a extend (that is, the X axis direction and the Y axis direction). More specifically, the first magnetic portion 21 and the second magnetic portion 22 are disposed on one end side and the other end side of a bottom surface of the lower magnetic body 20 in a diagonal direction. The third magnetic portion 23 is disposed between the first magnetic portion 21 and the second magnetic portion 22. Since the first magnetic portion 21, the second magnetic portion 22 and the third magnetic portion 23 are disposed in this way, the first magnetic portion 21, the second magnetic portion 22, and the third magnetic portion 23 generate a magnetic field, for example, in a direction parallel to a diagonal direction of a bottom surface of the casing 40.

The cap structure 30 is a plate-shaped member and has a rectangular shape when seen in the Z axis direction. The cap structure 30 is disposed on a surface side of the mirror structure 10 on which the mirror 16 is disposed, that is, on the positive side of the Z axis. The cap structure 30 may be formed using, for example, a neodymium type magnet or a samarium cobalt type magnet. A first region 31 and a second region 32 are disposed in a direction intersecting a direction in which each side of the second coil 17a and the first coil 18a extends (that is, the X axis direction and the Y axis direction).

Incidentally, it has already been described that the resonance frequency of the first vibration system is higher than the resonance frequency of the second vibration system. On the basis of this relationship, in the following explanation, a configuration relating to the first vibration system may be explained using the name of "fast." For example, the straight line A1 related to the first vibration system may be also referred to as a "fast axis" (first drive axis), the resonance frequency of the first vibration system may be also referred to as a "fast axis resonance frequency," and the first coil relating to the first vibration system may be also refer to as a "fast axis coil," On the other hand, a configuration relating to the second vibration system may be described using the name of "slow." For example, the straight line A2 relating to the second vibration system may be also referred to as a "slow axis" (second drive axis), the resonance frequency of the second vibration system may be also referred to as a "slow axis resonance frequency," and the second coil relating to the second vibration system may be also referred to as a "slow axis coil."

Figure 5:
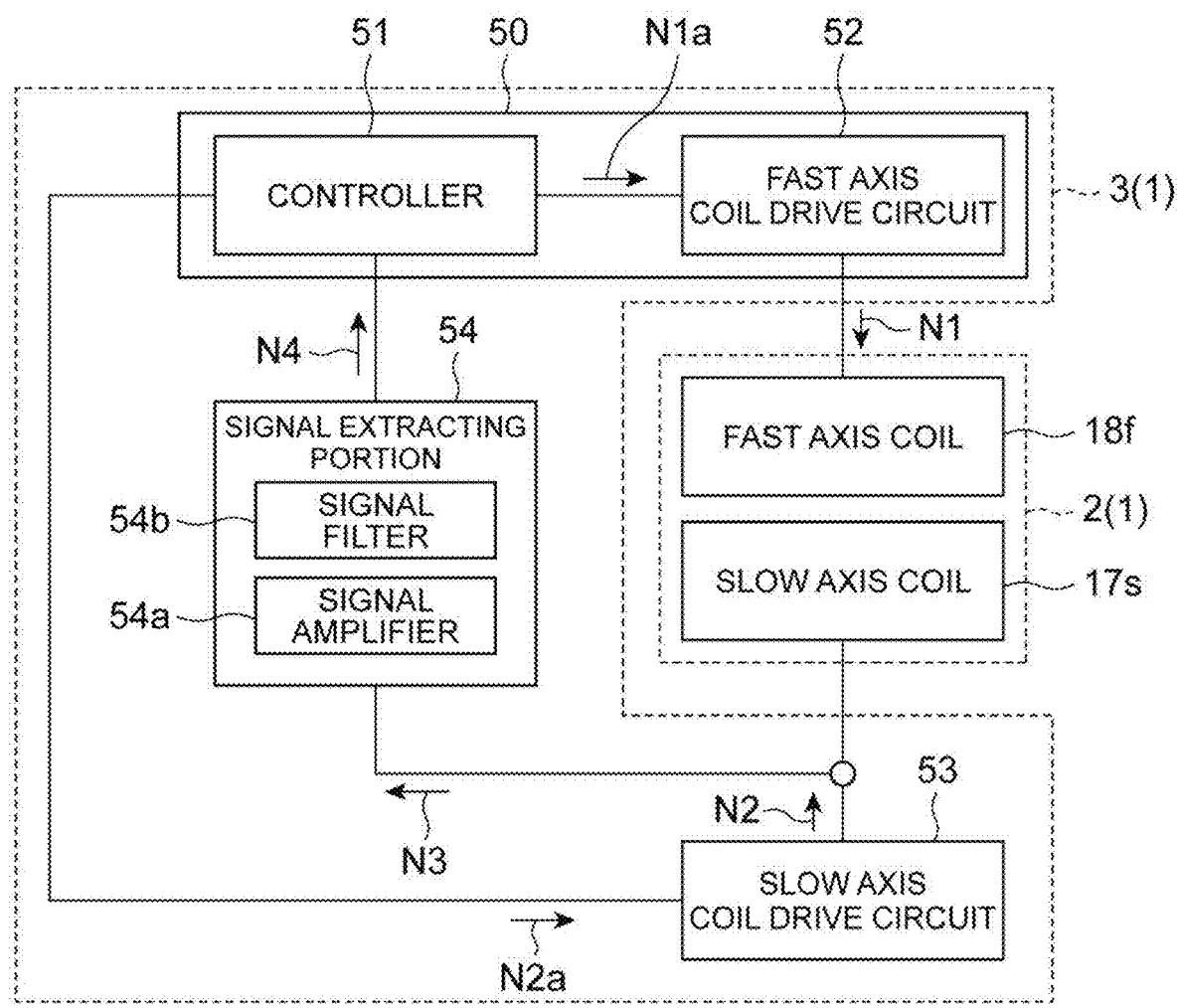
FIG. 5 is a block diagram showing a configuration of the control unit shown in FIG. 1.

FIG. 5 is a block diagram showing a configuration of the control unit 3. The control unit 3 generates a driving signal for controlling the mirror unit 2. The control unit 3 includes a controller 51, a fast axis coil drive circuit 52, a slow axis coil drive circuit 53, and a signal extracting portion 54.

Figure 6:
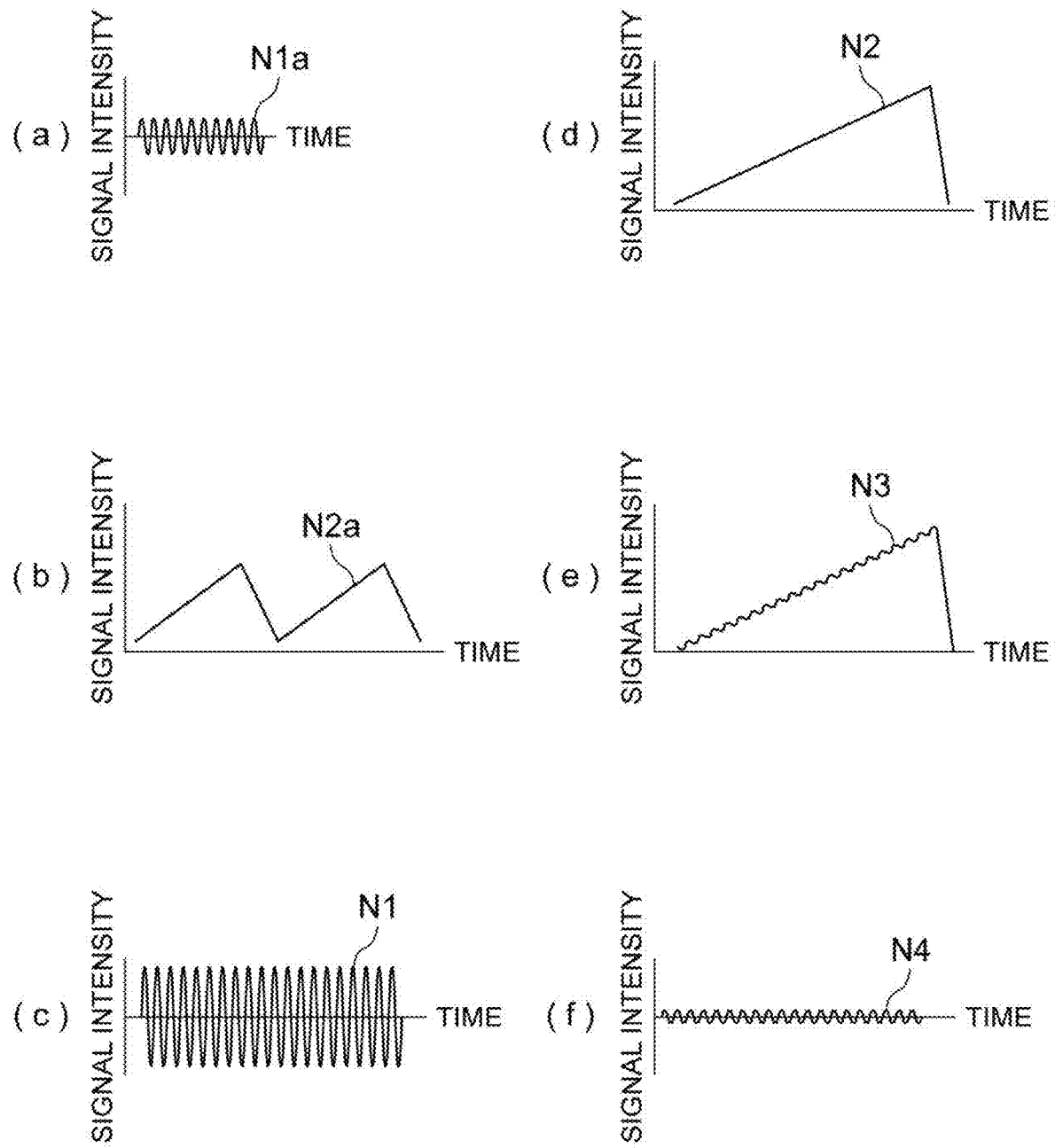
FIG. 6 is a diagram showing signals handled in a control unit.

The controller 51 generates a fast axis control signal (first control signal) N1a (refer to (a) of FIG. 6) and a slow axis control signal (second control signal) N2a (refer to (b) of FIG. 6). The fast axis control signal N1a is a control signal for rotating the mirror 16 around the fast axis A1f. The fast axis control signal N1a is a signal including a component of the fast axis resonance frequency which is the resonance frequency of the first vibration system. The controller 51 sets a waveform of the fast axis control signal N1a to a sinusoidal waveform and sets a frequency (fast axis control frequency) of the fast axis control signal N1a to the fast axis resonance frequency (first value). The waveform of the fast axis control signal N1a is not limited to the sinusoidal waveform and may be another shape such as a rectangular shape. A slow axis control signal N2a is a control signal for rotating the mirror 16 around the straight line A2. The controller 51 sets a waveform of the slow axis control signal N2a to a sawtooth waveform or a triangular waveform and also sets a frequency (slow axis control frequency) of the slow axis control signal N2a. The slow axis control frequency is generally set to be lower than the slow axis resonance frequency (second value). In general, since the slow axis resonance frequency (second value) is about $\frac{1}{100}$ to $\frac{1}{1000}$ of the fast axis resonance frequency (first value), the second value is smaller than the first value. The waveform of the slow axis control signal N2a is not limited to the sawtooth waveform or the triangular waveform.

Here, the frequency of the fast axis control signal N1a is appropriately changed according to the state of the mirror unit 2. The fast axis resonance frequency changes according to an environment in which the mirror unit 2 is disposed and a use time. For example, when a temperature changes, a torsional rigidity of a material of the first beam portions 15_1 and 15_2 change, and thus the fast axis resonance frequency also changes. Accordingly, when the frequency of the fast axis control signal N1a is set to a preset fixed value, the frequency of the fast axis control signal N1a may deviate from an actual fast axis resonance frequency (i.e., the first value). Therefore, the controller 51 has a configuration which appropriately adjusts the frequency of the fast axis control signal N1a. The configuration which adjusts the frequency of the fast axis control signal N1a will be described later in detail.

The fast axis coil drive circuit 52 is connected to the controller 51 and receives the fast axis control signal N1a from the controller 51. The fast axis coil drive circuit 52 generates a fast axis driving signal N1 (refer to (c) of FIG. 6) according to the fast axis control signal N1a. Then, the fast axis coil drive circuit 52 is electrically connected to the fast axis coil 18f and outputs the fast axis driving signal N1 to the fast axis coil 18f. The slow axis coil drive circuit 53 is connected to the controller 51 and receives the slow axis control signal N2a from the controller 51. The slow axis coil drive circuit 53 generates a slow axis driving signal N2 (refer to (d) of FIG. 6) according to the slow axis control signal N2a. Then, the slow axis coil drive circuit 53 is electrically connected to the slow axis coil 17s and outputs the slow axis driving signal N2 to the slow axis coil 17s.

The signal extracting portion 54 is electrically connected to the slow axis coil drive circuit 53 and the slow axis coil 17s. That is, the signal extracting portion 54 is electrically connected to a slow axis drive portion (second drive portion D2). The signal extracting portion 54 acquires a synthesized signal N3 (refer to (e) in FIG. 6) output from the slow axis coil 17s. Then, the signal extracting portion 54 extracts an induced signal N4 (refer to (f) in FIG. 6) used for generating the frequency of the fast axis control signal N1a from the acquired synthesized signal N3. The signal extracting portion 54 outputs the extracted induced signal N4 to the controller 51.

Here, the inventor has found that the fast axis coil 18f and the slow axis coil 17s are magnetically coupled to each other, and when the fast axis coil 18f rotates, a counter electromotive force is generated in the slow axis coil 17s in accordance with the rotating. A signal resulting from this counter electromotive force is the induced signal N4. This induced signal N4 is obtained by the signal extracting portion 54. The signal extracting portion 54 extracts the induced signal N4 from the synthesized signal N3 obtained from the slow axis coil 17s. Here, the synthesized signal N3 (refer to (e) in FIG. 6) input to the signal extracting portion 54 includes the slow axis driving signal N2 (refer to (d) in FIG. 6) in addition to the induced signal N4 (refer to (f) in FIG. 6) caused by the counter electromotive force. Therefore, the signal extracting portion 54 extracts the induced signal N4 from the synthesized signal N3 using a signal amplifier (signal amplifier portion) 54a (signal amplification portion), a signal filter (signal filter portion) 54b, or the like. For example, the signal amplifier 54a amplifies a frequency component included in the induced signal N4. Further, the signal filter 54b passes the frequency component included in the induced signal N4 and attenuates a frequency component included in the slow axis driving signal N2. The signal extracting portion 54 may include both the signal amplifier 54a and the signal filter 54b, or may include one of them.

Figure 7:
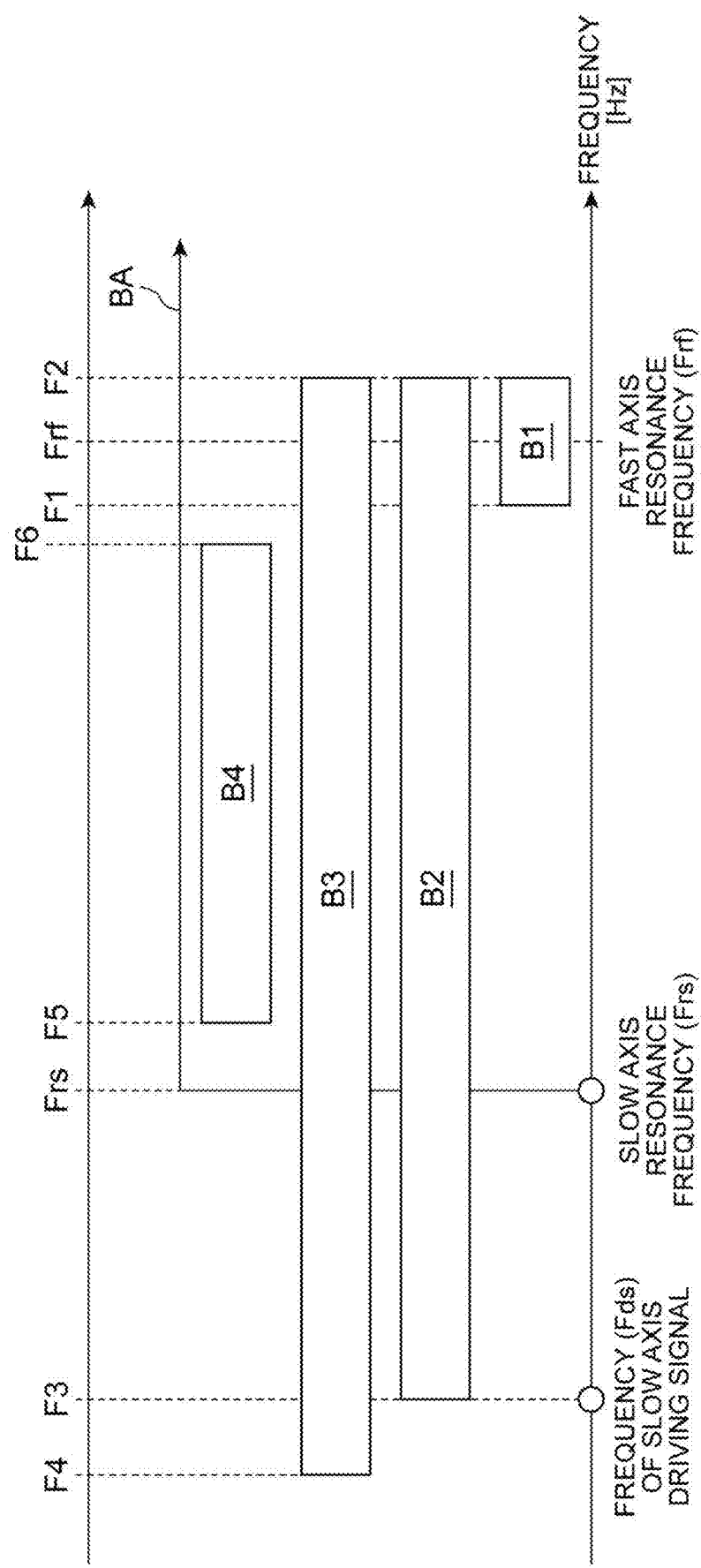
FIG. 7 is a diagram showing a band of a signal extracted in a signal extraction unit shown in FIG. 5.

Here, a frequency band extracted by the signal extracting portion 54 will be described. As shown in FIG. 7, a frequency of a band BA extracted by the signal extracting portion 54 is larger than at least the slow axis resonance frequency Frs.

For example, a first range (F1≤F≤F2) shown in a band B1 is suitable as the band extracted by the signal extracting portion 54. A first lower limit frequency (F1) is smaller than the fast axis resonance frequency (Frf) and larger than the frequency (Fds) of the slow axis driving signal N2 and the slow axis resonance frequency (Frs). A first upper limit frequency (F2) is larger than the fast axis resonance frequency (Frf). Further, a second range (F3≤F≤F2) shown in a band B2 is suitable as the band extracted by the signal extracting portion 54. A second lower limit frequency (F3) is equal to or lower than the slow axis resonance frequency (Frs) and also larger than the frequency (Fds) of the slow axis driving signal N2. That is, the second lower limit frequency (F3) does not include the frequency (Fds) of the slow axis driving signal N2.

On the other hand, a third range (F4≤F≤F2) shown in a band B3 is not suitable as the band extracted by the signal extracting portion 54. A third lower limit frequency (F4) is equal to or lower than the frequency (Fds) of the slow axis driving signal N2. Also, a fourth range (F5≤F≤F6) shown in a band B4 is not suitable as the band extracted by the signal extracting portion 54. A fourth lower limit frequency (F5) is larger than the slow axis resonance frequency (Frs). A second upper limit frequency (F6) is larger than the slow axis resonance frequency (Frs) and also smaller than the fast axis resonance frequency (Frf).

Figure 8:
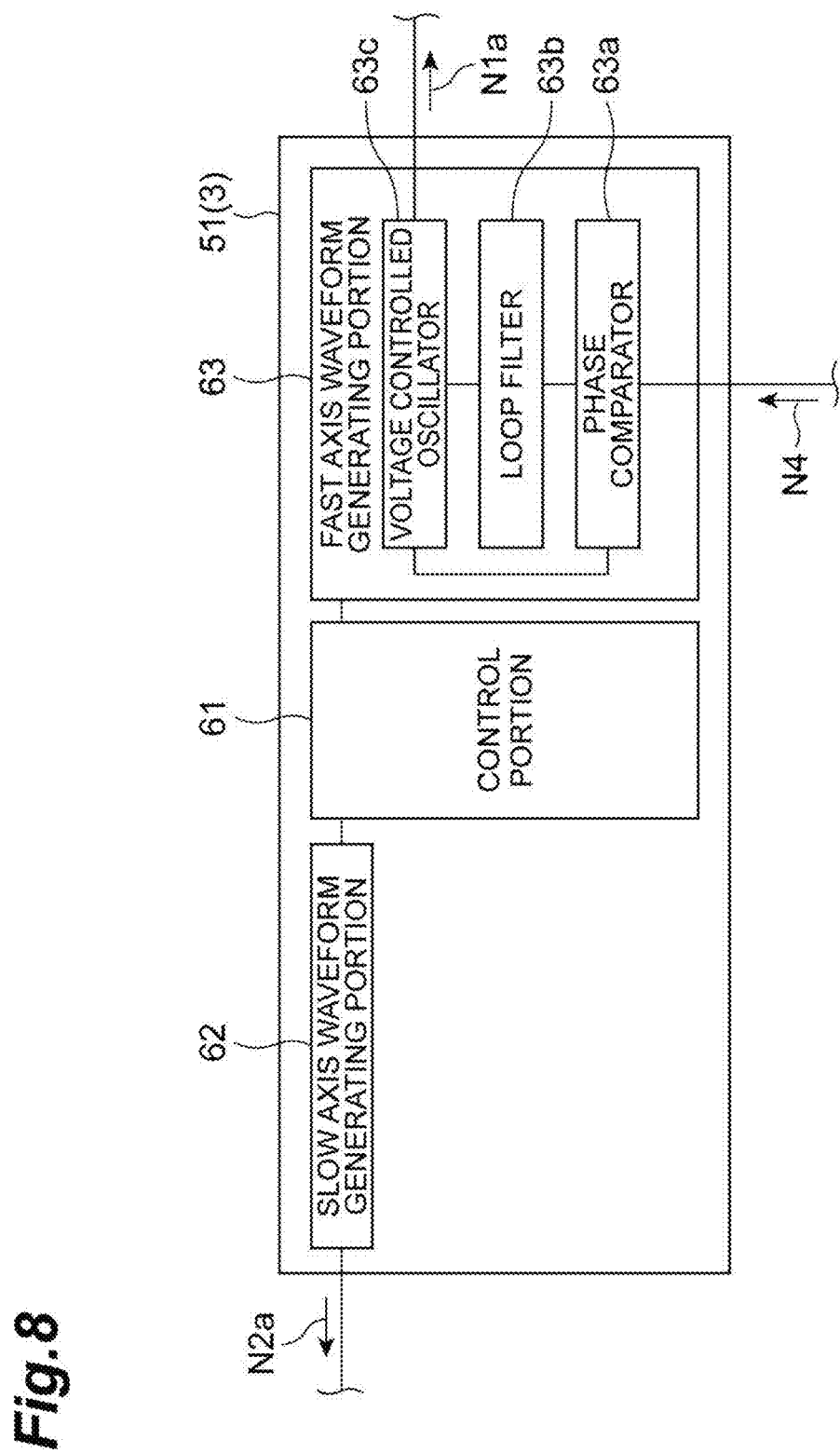
FIG. 8 is a block diagram showing a configuration of a controller shown in FIG. 5.

Hereinafter, the configuration and operation of the controller 51 will be specifically described. FIG. 8 is a block diagram showing the configuration of the controller 51.

Figure 9:
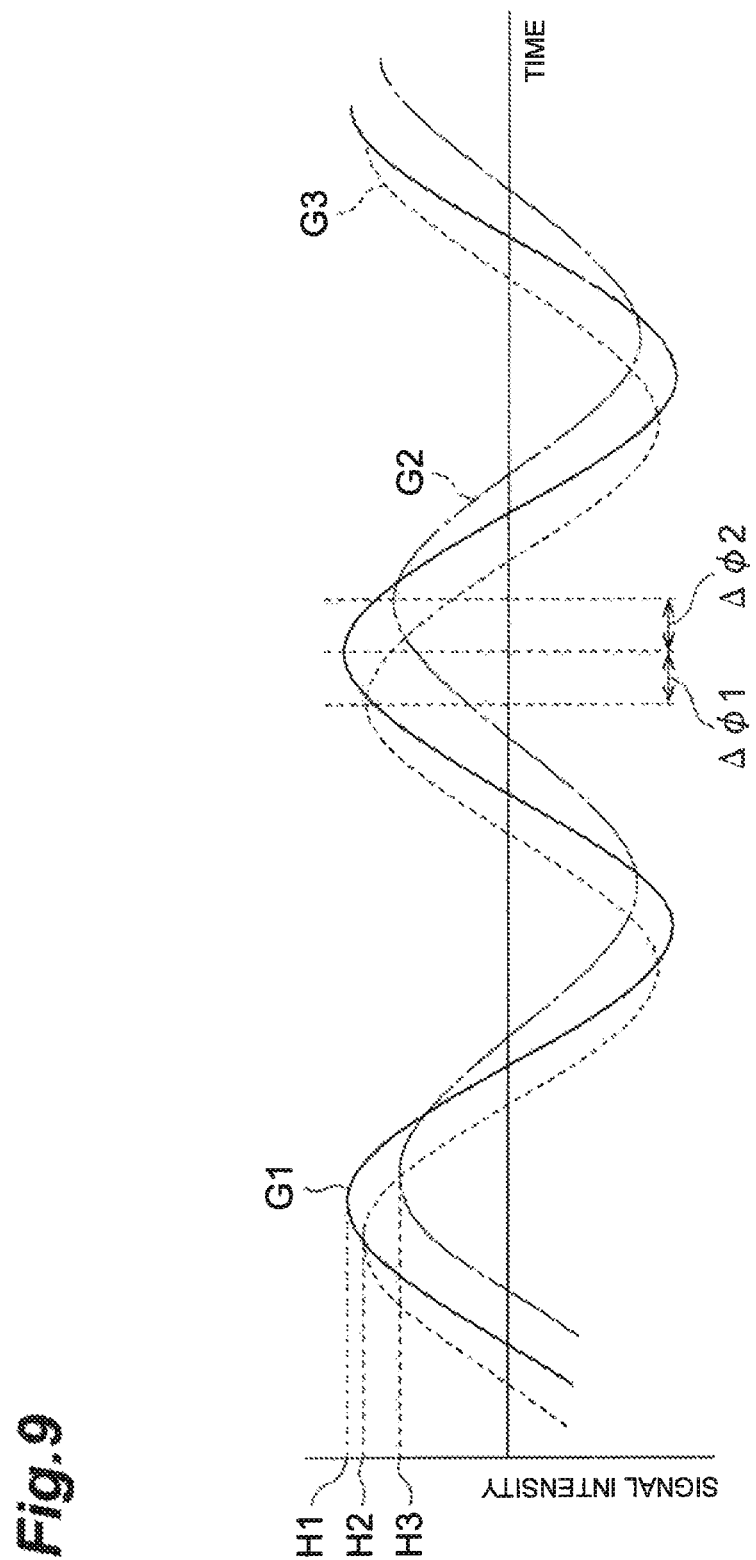
FIG. 9 is a graph showing a phase relationship between a driving signal and an induced signal and an amplitude relationship between the driving signal and the induced signal.

The induced signal N4 generated in the slow axis coil 17s depends on a frequency and an amplitude of the rotating of the fast axis coil 18f. Therefore, it is possible to know a rotation state of the mirror 16 around the fast axis A1f by observing the induced signal N4. In other words, the induced signal N4 is related to the fast axis resonance frequency, not the fast axis driving signal N1. FIG. 9 shows time waveforms G1, G2, and G3. The time waveform G1 shows the induced signal N4 when the frequency of the fast axis driving signal N1 coincides with the fast axis resonance frequency (22.05 kHz). The time waveform G2 shows the induced signal N4 when the frequency of the fast axis driving signal N1 coincides with a frequency (22.06 kHz) obtained by adding 10 Hz to the fast axis resonance frequency. The time waveform G3 shows the induced signal N4 when the frequency of the fast axis driving signal N1 coincides with a frequency (22.04 kHz) obtained by subtracting 10 Hz from the fast axis resonance frequency. As can be seen from FIG. 9, for example, when the fast axis resonance frequency coincides with the frequency of the fast axis driving signal N1, a difference (phase difference) between a phase of the fast axis driving signal N1 and a phase of the rotating of the mirror 16 around the fast axis A1f is a constant value (for example, zero). On the other hand, when the fast axis resonance frequency does not coincide with the frequency of the fast axis driving signal N1, a difference (phase difference) occurs between the phase of the fast axis driving signal N1 and the phase of the flapping-rotating of the mirror 16 around the fast axis A1f. That is, it is possible to know whether or not the rotating of the mirror 16 around the fast axis A1f is in the resonance state by obtaining the phase difference (refer to the phase differences Δφ1 and Δφ2 in FIG. 9) between the phase of the fast axis driving signal N1 and the phase of the induced signal N4 generated in the slow axis coil 17s. Therefore, the frequency of the fast axis driving signal N1 may be adjusted so that the phase difference between the phase of the fast axis driving signal N1 and the phase of the induced signal N4 generated in the slow axis coil 17s becomes a constant value (for example, zero).

Therefore, the controller 51 adjusts the frequency of the fast axis control signal N1a so that the phase difference is close to the constant value (for example, zero). As shown in FIG. 8, the controller 51 includes a control portion 61, a slow axis waveform generating portion 62, and a fast axis waveform generating portion 63. The control portion 61 controls operations of the slow axis waveform generating portion 62 and the fast axis waveform generating portion 63.

The slow axis waveform generating portion 62 generates a slow axis control signal N2a having a sawtooth waveform. Additionally, the slow axis waveform generating portion 62 outputs a generated signal to the slow axis coil drive circuit 53.

The fast axis waveform generating portion 63 generates the fast axis control signal N1a having a sinusoidal waveform. Additionally, the fast axis waveform generating portion 63 outputs the fast axis control signal N1a to the fast axis coil drive circuit 52.

The fast axis waveform generating portion 63 includes a phase comparator 63a, a loop filter 63b, and a voltage controlled oscillator 63c. Due to such a configuration, the fast axis waveform generating portion 63 has a function as a so-called phase lock loop (PLL). That is, the fast axis waveform generating portion 63 synchronizes the phase of the fast axis control signal N1a generated by the voltage controlled oscillator 63c with the phase of the induced signal N4 input from the signal extracting portion 54. The phase comparator 63a obtains a phase difference by comparing the induced signal N4 input from the signal extracting portion 54 with the fast axis control signal N1a input from the voltage controlled oscillator 63c. Then, the phase comparator 63a outputs a phase signal corresponding to the phase difference to the loop filter 63b. The loop filter 63b obtains a processed phase signal by attenuating unnecessary high frequency components included in the phase signal. Then, the loop filter 63b outputs the processed phase signal to the voltage controlled oscillator 63c. The voltage controlled oscillator 63c outputs a frequency corresponding to a magnitude (voltage) of the processed phase signal input from the loop filter 63b.

Figure 10:
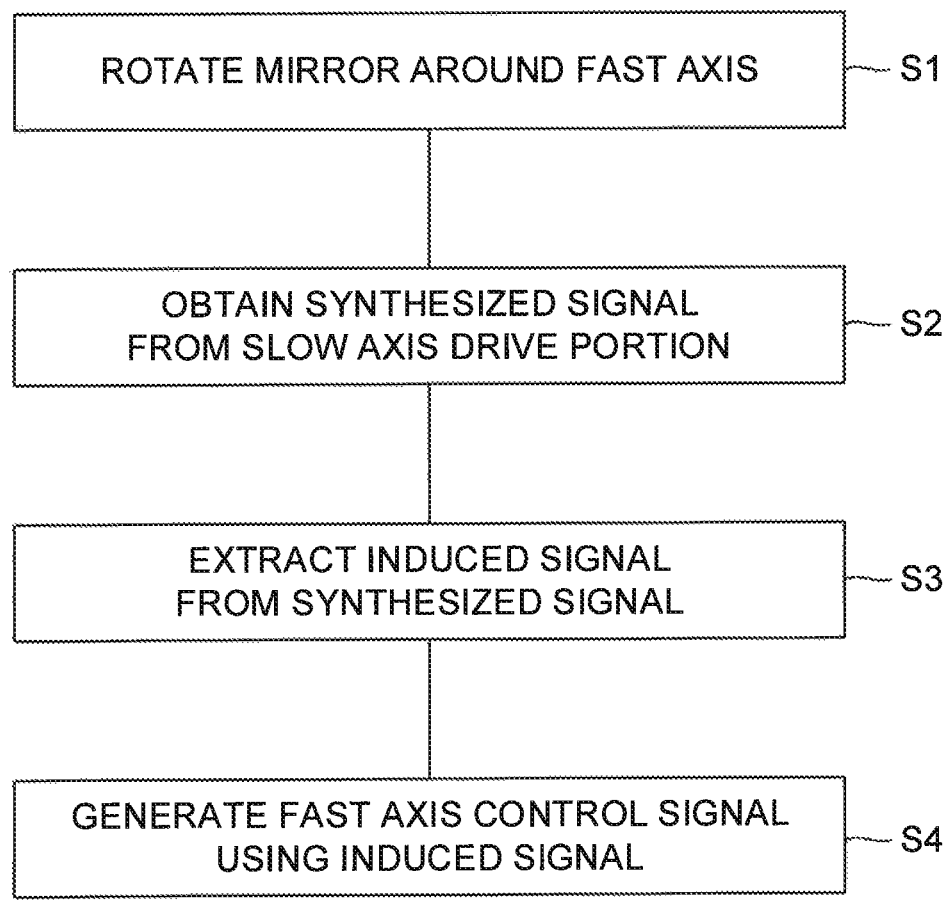
FIG. 10 is a diagram showing main steps in a mirror drive method.

Continuously, a drive method of the mirror device 1 will be described. FIG. 10 is a diagram showing main steps in the mirror drive method. As shown in FIG. 10, first, a step (rotating step) S1 of rotating the mirror 16 around the fast axis A1f is performed. This step S1 is performed by the controller 51 of the control unit 3, the fast axis coil drive circuit 52 and the fast axis coil 18f. Next, a step (acquiring step) S2 of acquiring the synthesized signal N3 from the slow axis drive portion D2 is performed. This step S2 is performed by the slow axis coil 17s and the signal extracting portion 54 of the control unit 3.

Next, a step (extracting step) S3 of extracting the induced signal N4 from the synthesized signal N3 is performed. This step S3 is performed by the signal extracting portion 54 of the control unit 3. Next, a step (generating step) S4 of generating the fast axis control signal N1a is performed according to the induced signal N4. This step S4 is performed by the controller 51 of the control unit 3. More specifically, the step S4 is performed by the control portion 61 of the controller 51, the fast axis waveform generating portion 63, the voltage controlled oscillator 63c, the loop filter 63b, and the phase comparator 63a.

The phase difference between the phase of the fast axis control signal N1a and the phase of the induced signal N4 is close to a constant value (for example, zero) by repeating the steps S1, S2, S3 and S4. Therefore, since the frequency of the fast axis control signal N1a is maintained at the fast axis resonance frequency (Frf), the rotating of the mirror 16 around the fast axis A1f is maintained in the resonance state.

In the mirror unit 2, the mirror 16 is rotated around the fast axis A1f. While the mirror 16 rotates around the fast axis A1f, the signal extracting portion 54 obtains the synthesized signal N3 from the slow axis drive portion D2. Specifically, the signal extracting portion 54 obtains the synthesized signal N3 from the slow axis coil 17s of the slow axis drive portion D2. The synthesized signal N3 includes the induced signal N4. The induced signal N4 is a signal generated in the slow axis drive portion D2 due to an operation of rotating the mirror 16 around the fast axis A1f. That is, since the induced signal N4 is caused by the operation of the mirror 16, the frequency of the induced signal N4 corresponds to the frequency in the rotating of the mirror 16 with respect to the fast axis A1f. The frequency of the rotating of the mirror 16 with respect to the fast axis A1f is higher than the frequency of the rotating of the mirror 16 with respect to the slow axis A2s. Therefore, it is possible to easily extract the induced signal N4 from the synthesized signal N3 obtained from the slow axis drive portion D2. Additionally, a signal generating portion 50 is electrically connected to the signal extracting portion 54 and the fast axis drive portion (first drive portion D1) and generates a driving signal to be supplied to the fast axis coil 18f according to the induced signal N4. Therefore, a result of rotating the mirror 16 by the fast axis coil 18f can be obtained as the induced signal N4 from the slow axis coil 17s. Accordingly, since a feedback loop system relating to the rotating of the mirror 16 with respect to the fast axis A1f is formed, it is possible to reliably drive the mirror 16 with respect to the fast axis A1f in the resonance state.

The above-described embodiment shows an example of the mirror device and the drive method of the mirror. The mirror device and the drive method of the mirror are not limited to the mirror device and the mirror drive method according to the embodiment and may be modified or applied to another as long as the gist described in each claim is not changed.

In the above-described embodiment, the mirror 16 was rotated around the fast axis A1f and the slow axis A2s, but the present disclosure is not limited to this configuration. For example, the mirror 16 may be configured to rotate only around the fast axis A1f. Even in this case, when the mirror 16 is rotated around the fast axis A1f, a counter electromotive force is generated in the slow axis coil 17s. Therefore, the feedback loop system can be easily constituted by using this counter electromotive force, and thus the mirror 16 can be reliably driven in the resonance state.

In the above-described embodiment, the fast axis waveform generating portion 63 has adjusted the frequency of the fast axis control signal N1a according to the phase difference between the phase of the fast axis control signal N1a and the phase of the induced signal N4. As can be seen from FIG. 9, the difference between the frequency of the fast axis control signal N1a and the fast axis resonance frequency affects not only the phase difference but also the amplitude of the induced signal N4. Therefore, the frequency of the fast axis control signal N1a may be adjusted according to the amplitude of the induced signal N4. When the frequency of the fast axis control signal N1a is shifted from the fast axis resonance frequency, the rotation of the mirror 16 is not in the resonance state. Then, a rotation angle of the mirror 16 of which the rotation is not in the resonance state is smaller than a rotation angle of the mirror 16 of which the rotation is the resonance operation. When the rotating angle is small, a magnitude of a fluctuation of the magnetic field generated by the fast axis coil 18f also decreases. Therefore, a magnitude of the counter electromotive force (that is, the amplitude of the induced signal N4) generated in the slow axis coil 17s also decreases (refer to amplitudes H1, H2 and H3 in FIG. 9). Therefore, the fast axis waveform generating portion 63 sweeps the frequency of the fast axis driving signal N1 in a predetermined frequency band. Then, the fast axis waveform generating portion 63 determines that the frequency at which the amplitude of the induced signal N4 has a maximum value is the fast axis resonance frequency. Since the feedback loop system can be easily constituted even by adjusting the frequency of the fast axis driving signal N1 using such amplitude, the mirror 16 can be reliably driven in the resonance state.

In the above-described embodiment, the phase synchronization function in the fast axis waveform generating portion 63 has been configured as an analog circuit. The phase synchronization function in the fast axis waveform generating portion 63 may be configured not only as an analog circuit but also as a digital circuit (refer to FIG. 11) and may be configured as a combination of the analog circuit and the digital circuit (refer to FIG. 12).

Figure 11:
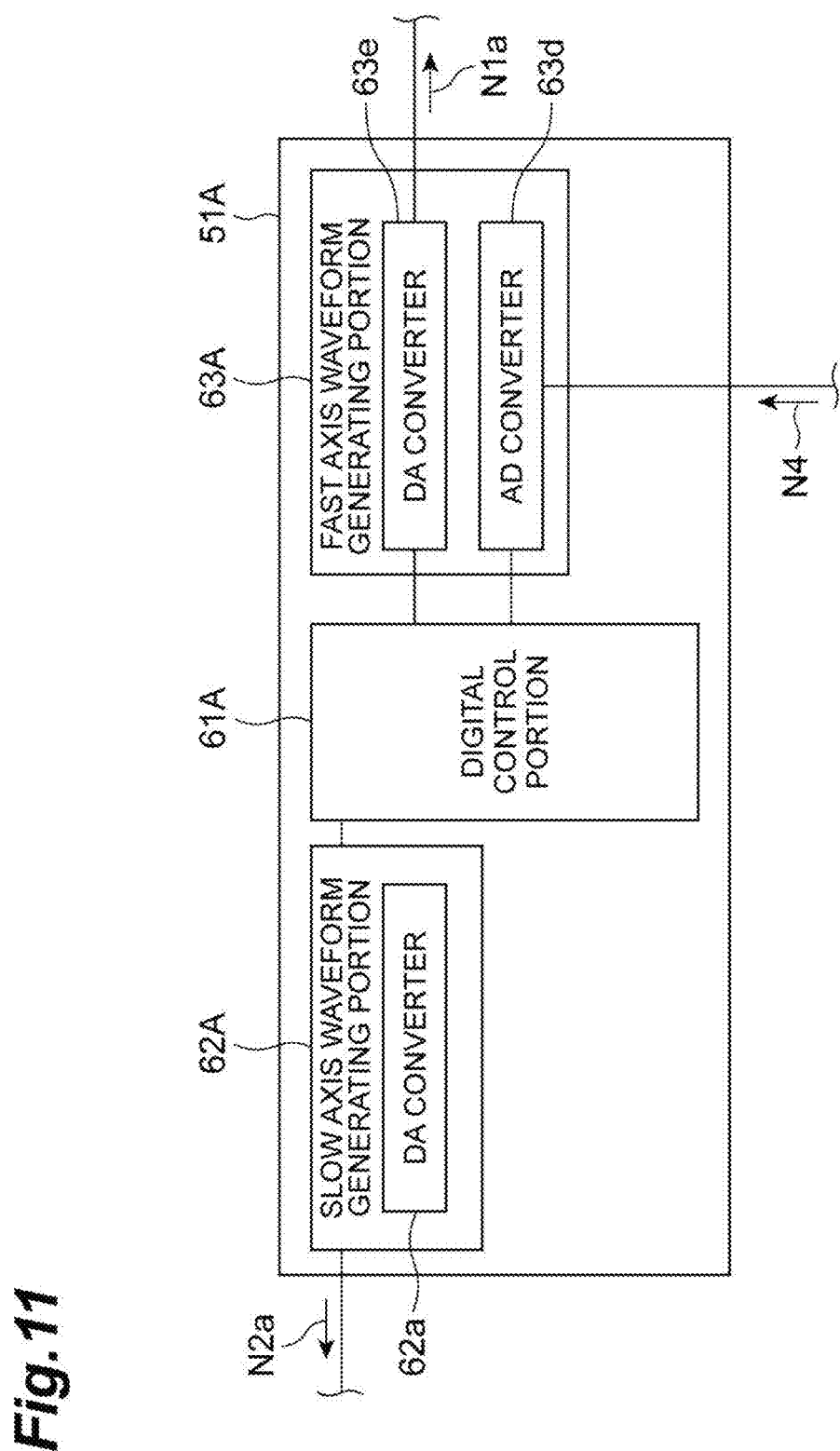
FIG. 11 is a block diagram showing a configuration of a controller included in a control unit according to a modified example.

As shown in FIG. 11, a controller 51A configured as a digital circuit has a digital control portion 61A, a slow axis waveform generating portion 62A, and a fast axis waveform generating portion 63A. The digital control portion 61A controls operations of the slow axis waveform generating portion 62A and the fast axis waveform generating portion 63A. The slow axis waveform generating portion 62A generates a slow axis control signal N2a provided to the slow axis coil drive circuit 53. The slow axis waveform generating portion 62A includes a DA converter 62a. The DA converter 62a converts the slow axis control signal N2a output as a digital value from the digital control portion 61A to the slow axis waveform generating portion 62A into an analog value. Then, the DA converter 62a outputs the slow axis control signal N2a converted into the analog value to the slow axis coil drive circuit 53. The fast axis waveform generating portion 63A generates the fast axis control signal N1a provided to the fast axis coil drive circuit 52. The fast axis waveform generating portion 63A includes an AD converter 63d and a DA converter 63e. The AD converter 63d receives the induced signal N4 which is an analog value from the signal extracting portion 54 and converts the induced signal N4 into a digital value. Then, the AD converter 63d outputs the induced signal N4 converted into the digital value to the digital control portion 61A. The digital control portion 61A outputs the fast axis control signal N1a, of which the frequency has been adjusted according to the induced signal N4, as a digital value to the DA converter 63e. In the controller 51A, the phase comparison is performed by the digital control portion 61A. The DA converter 63e converts the fast axis control signal N1a output as a digital value from the digital control portion 61A to the fast axis waveform generating portion 63A into an analog value. Then, the DA converter 63e outputs the fast axis control signal N1a converted into the analog value to the fast axis coil drive circuit 52.

Figure 12:
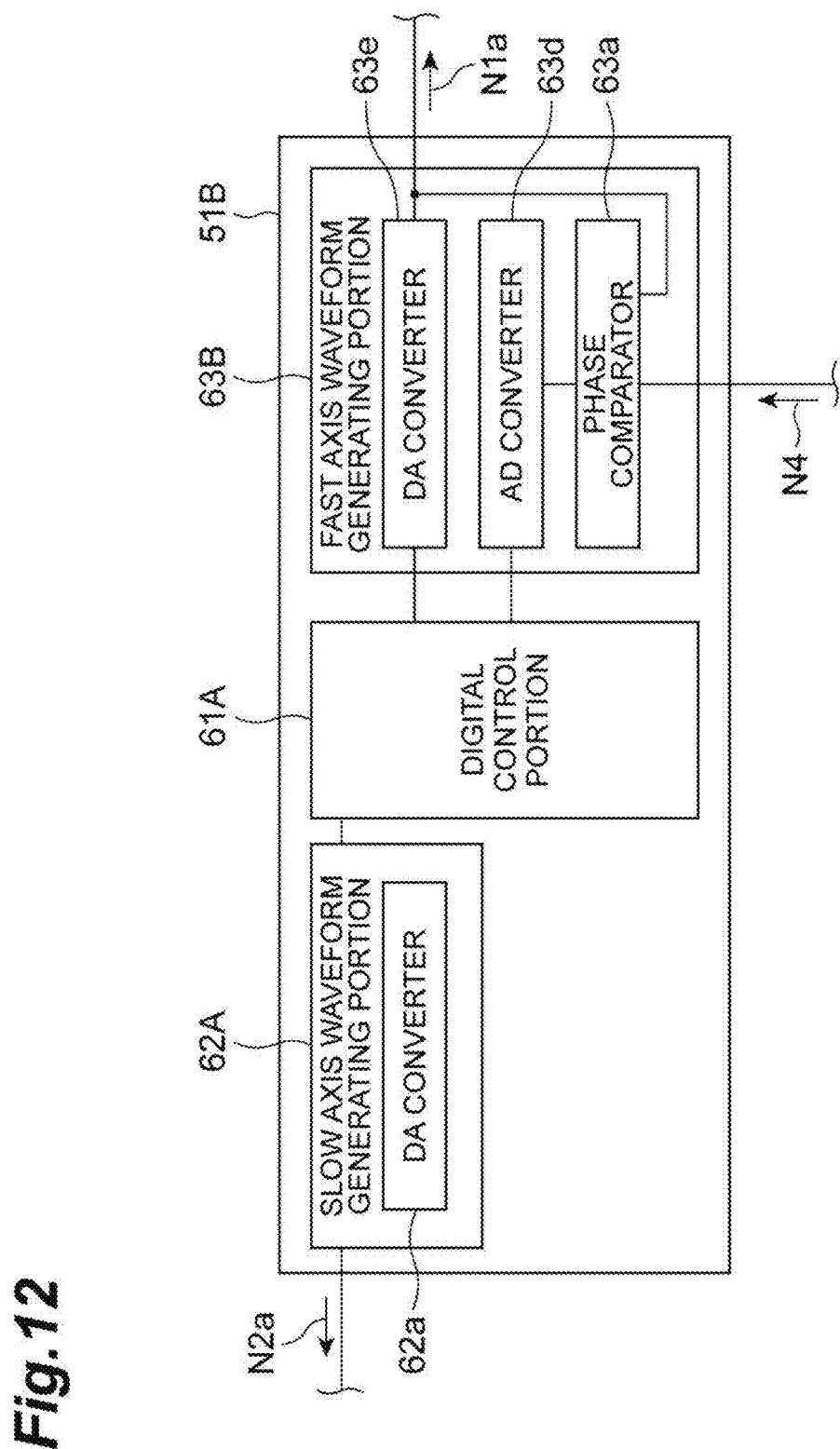
FIG. 12 is a block diagram showing a configuration of a controller included in a control unit according to another modified example.

As shown in FIG. 12, a controller 51B configured as a digital circuit has a digital control portion 61A, a slow axis waveform generating portion 62A, and a fast axis waveform generating portion 63B. Since the digital control portion 61A and the slow axis waveform generating portion 62A have the same configuration as the digital control portion 61A and the slow axis waveform generating portion 62A of the controller 51A shown in FIG. 11, the detailed description thereof will be omitted. The fast axis waveform generating portion 63B includes a phase comparator 63a, an AD converter 63d, and a DA converter 63e. The phase comparator 63a obtains a signal related to the phase difference between the phase of the fast axis control signal N1a output from the DA converter 63e and the phase of the induced signal N4 output from the signal extracting portion 54. Then, the phase comparator 63a outputs a signal related to the phase difference to the AD converter 63d. The AD converter 63d receives the signal related to the phase difference output from the phase comparator 63a and converts the signal related to the phase difference into a digital value. Then, the AD converter 63d outputs the signal converted into the digital value to the digital control portion 61A. In the controller 51B, the phase comparison is performed by the phase comparator 63a.

Figure 13:
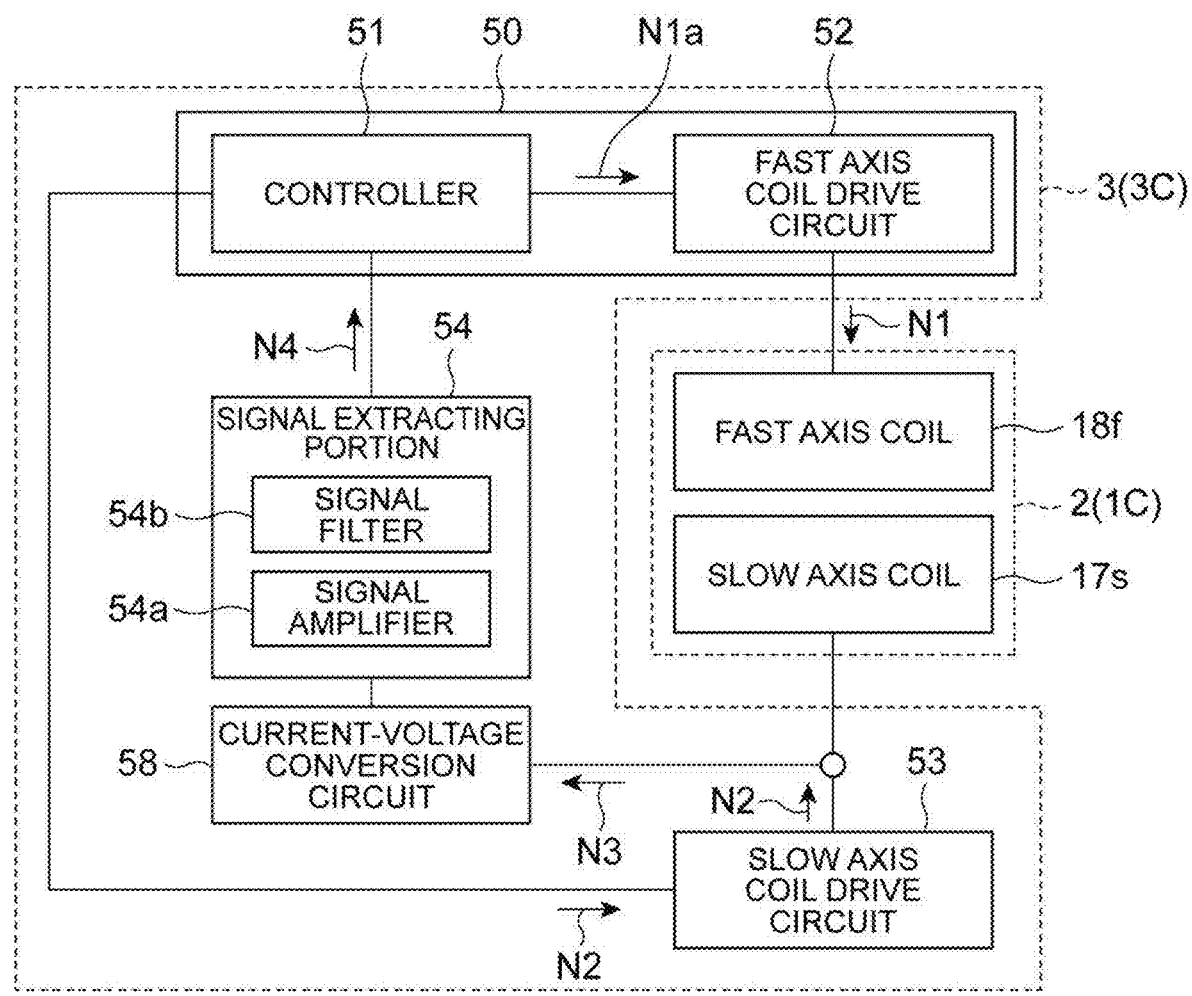
FIG. 13 is a block diagram showing a configuration of a control unit according to yet another modified example.

In the above-described embodiment, the signal extracting portion 54 treats the induced signal. N4 as a voltage. The signal extracting portion 54 may treat the induced signal N4 as a current. In other words, the counter electromotive force generated in the slow axis coil 17s may be handled as fluctuation of the current. In this case, the induced signal N4 may be directly extracted from the synthesized signal N3 showing the fluctuation of the current. Further, as shown in FIG. 13, a control unit 3C of the mirror device IC may have a current-voltage conversion circuit 58 between the slow axis coil 17s and the signal extracting portion 54. Then, in the current-voltage conversion circuit 58, the synthesized signal N3 output as the fluctuation of the current may be converted into a voltage, and then the converted synthesized signal N3 may be input to the signal extracting portion 54.

Figure 14:
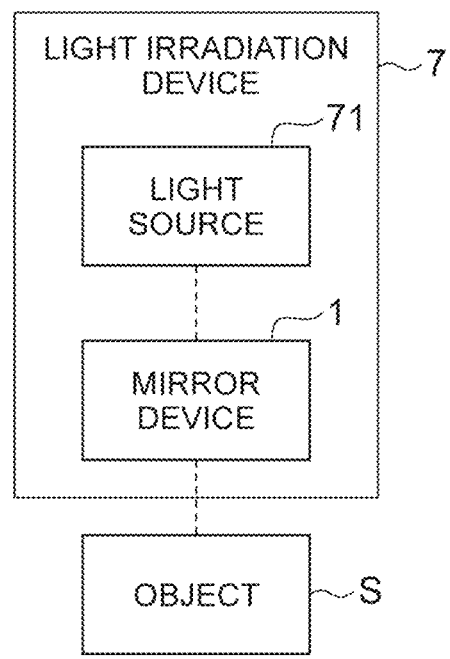
FIG. 14 is a schematic diagram showing a configuration of a light irradiation device including a mirror device.
Figure 15:
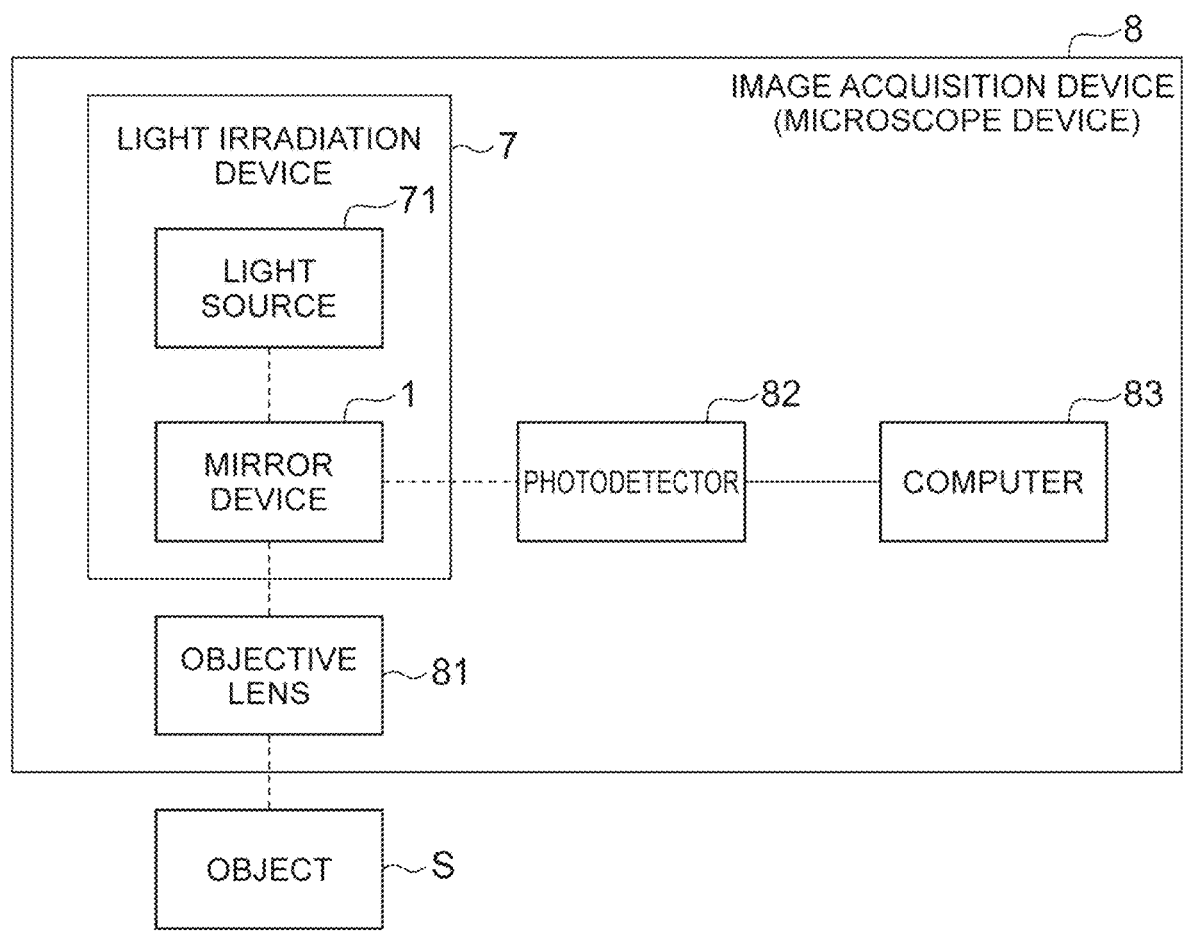
FIG. 15 is a schematic diagram showing a configuration of an image acquisition device including a mirror device.

Further, the mirror device 1 is used for a light irradiation device and an image acquisition device. For example, FIG. 14 shows a light irradiation device 7 such as a head-up display or a projector. The light irradiation device 7 includes a light source 71 and a mirror device 1 and irradiates light onto an object S such as a front glass or a screen. FIG. 15 shows an image acquisition device 8 such as a microscope device. For example, the microscope device includes a reflection type microscope or a transmission type microscope, a fluorescence microscope, a confocal microscope, a light sheet microscope, and an STED microscope. The image acquisition device 8 includes the light irradiation device 7, an objective lens 81 which irradiates the object S with the light output from the light irradiation device 7, a photodetector 82 which detects light (for example, fluorescence or transmitted light, reflected light, or the like) generated in the object S according to the irradiation of light, and a computer 83 which generates an image of the object S on the basis of a detection signal outputted from the photodetector 82. An example of the photodetector 82 is an image sensor, a photodiode, a photomultiplier, or the like. In addition, the light generated in the object S may be detected by the photodetector 82 via the mirror device 1 or may be detected by the photodetector 82 without passing through the mirror device 1.

REFERENCE SIGNS LIST

1 Mirror device
2 Mirror unit
3 Control unit
10 Mirror structure
11 Support portion
12 Second movable portion
13 First movable portion
14_1, 14_2 Second beam portion
15_1, 15_2 First beam portion
16 Mirror
17a Second coil
17s Slow axis coil
18a First coil
18f Fast axis coil
20 Lower magnetic body
30 Cap structure
31 First region
32 Second region
40 Casing
50 Signal generating portion
51, 51A, 51B Controller
52 Fast axis coil drive circuit
53 Slow axis coil drive circuit
54 Signal extracting portion 54a Signal amplifier
54b Signal filter
63a Phase comparator
63b Loop filter
63c Voltage controlled oscillator
58 Current-voltage conversion circuit
61 Control portion
61A Digital control portion
62, 62A Slow axis waveform generating portion
62a, 63e DA converter
63, 63A, 63B Fast axis waveform generating portion
63d AD converter
A1f Fast axis
A2s Slow axis
D1 First drive portion
D2 Second drive portion
N1 Fast axis driving signal
N2 Slow axis driving signal
N3 Synthesized signal
N4 Induced signal

The invention claimed is:

1. A mirror device comprising:
a mirror supported to be rotatable around a first drive axis and supported to be rotatable around a second drive axis intersecting the first drive axis and in which a resonance frequency of rotating thereof with respect to the first drive axis is a first value and a resonance frequency of the rotating thereof with respect to the second drive axis is a second value lower than the first value;
a first drive portion configured to rotate the mirror around the first drive axis;
a second drive portion configured to rotate the mirror around the second drive axis;
a signal extracting portion configured to obtain from the second drive portion a synthesized signal including an induced signal generated in the second driving portion due to an operation of rotating the mirror around the first drive axis and configured to extract the induced signal from the synthesized signal; and
a signal generating portion configured to generate a driving signal which controls the first drive portion so that the rotating of the mirror with respect to the first drive axis is in a resonance state according to the induced signal extracted by the signal extracting portion.

2. The mirror device according to claim 1, wherein the signal generating portion generates the driving signal according to a phase difference between a phase of the driving signal input from the signal generating portion to the first drive portion and a phase of the induced signal obtained by the signal extracting portion.

3. The mirror device according to claim 2, wherein the signal generating portion generates the driving signal so that the phase difference becomes a constant value.

4. The mirror device according to claim 3, wherein the constant value is zero.

5. The mirror device according to claim 1, wherein the signal generating portion generates the driving signal according to an amplitude of the induced signal obtained by the signal extracting portion.

6. The mirror device according to claim 5, wherein the signal generating portion generates the driving signal so that the amplitude of the induced signal increases.

7. The mirror device according to claim 1, wherein the signal extracting portion includes a signal amplification portion, and
the signal amplification portion amplifies a signal including a frequency higher than the second value.

8. The mirror device according to claim 1, wherein the signal extracting portion includes a signal filter portion, and
the signal amplification portion passes a signal including a frequency higher than the second value.

9. The mirror device according to claim 8, wherein the signal filter portion attenuates a signal including a frequency smaller than the second value.

10. A light irradiation device which irradiates light onto an object, comprising:
a light source configured to output the light, and
the mirror device according to claim 1 configured to scan the light output from the light source.

11. An image acquisition device which acquires an image of an object, comprising:
a light irradiation device according to claim 10; and
a photodetector configured to detect light generated in the object according to radiation of the light by the light irradiation device.

12. A drive method of a mirror which is supported to be rotatable around a first drive axis and is supported to be rotatable around a second drive axis intersecting the first drive axis and in which a resonance frequency of rotating thereof with respect to the first drive axis is a first value and a resonance frequency of the rotating thereof with respect to the second drive axis is a second value lower than the first value, the method comprising:
a rotation step of controlling a first drive portion and rotating the mirror around the first drive axis;
an acquiring step of obtaining from a second drive portion a synthesized signal including an induced signal generated in the second drive portion, which rotates the mirror around the second drive axis, due to an operation of rotating the mirror around the first drive axis;
an extracting step of extracting the induced signal from the synthesized signal; and
a generating step of generating a driving signal which controls the first drive portion so that the rotating of the mirror with respect to the first drive axis is in a resonance state according to the induced signal.

* * * * *